(12) United States Patent
Roberts

(10) Patent No.: US 7,672,708 B2
(45) Date of Patent: *Mar. 2, 2010

(54) METHOD AND APPARATUS FOR THE NON-INVASIVE IMAGING OF ANATOMIC TISSUE STRUCTURES

(76) Inventor: David Roberts, 412 Cedar Spring Rd., Kennett Square, PA (US) 19348

( * ) Notice: Subject to any disclaimer, the term of this patent is extended or adjusted under 35 U.S.C. 154(b) by 1728 days.

This patent is subject to a terminal disclaimer.

(21) Appl. No.: 10/467,789

(22) PCT Filed: Feb. 12, 2001

(86) PCT No.: PCT/US01/04479

§ 371 (c)(1),
(2), (4) Date: Nov. 24, 2003

(87) PCT Pub. No.: WO02/064034

PCT Pub. Date: Aug. 22, 2002

(65) Prior Publication Data

US 2004/0076317 A1 Apr. 22, 2004

Related U.S. Application Data

(63) Continuation of application No. 09/121,351, filed on Jul. 23, 1998, now Pat. No. 6,205,235.

(51) Int. Cl.
*A61B 5/05* (2006.01)
(52) U.S. Cl. ........................ 600/410; 382/128; 382/131; 600/407
(58) Field of Classification Search ......... 600/407–410; 382/128–131
See application file for complete search history.

(56) References Cited

U.S. PATENT DOCUMENTS

| 4,945,478 | A  | * | 7/1990  | Merickel et al. ............ 382/131 |
| 5,185,809 | A  | * | 2/1993  | Kennedy et al. ............ 382/131 |
| 5,560,360 | A  |   | 10/1996 | Filler et al. |
| 5,757,953 | A  | * | 5/1998  | Jang .......................... 382/132 |
| 6,463,315 | B1 | * | 10/2002 | Klingberg et al. ............ 600/410 |
| 6,526,305 | B1 | * | 2/2003  | Mori .......................... 600/410 |
| 7,048,716 | B1 | * | 5/2006  | Kucharczyk et al. ... 604/164.01 |

(Continued)

OTHER PUBLICATIONS

Kottke et al., "Adaptive Segmentation of Coronary Angiograms", Proc. of the Fourteenth Annual Northeast Bioengineering Conference, Oct. 3, 1998; p. 287-290.

(Continued)

*Primary Examiner*—Long V Le
*Assistant Examiner*—Sanjay Cattungal
(74) *Attorney, Agent, or Firm*—Fox Rothschild LLP

(57) ABSTRACT

A method for the non-invasive imaging of an anatomic tissue structure in isolation from surrounding tissues, including: receiving from an input device magnetic imaging data from a patient of the anatomic tissue structure and surrounding tissues; segmenting the imaging data to isolate the anatomic tissue structure imaging data from the imaging data for the surrounding tissues; separating the anatomic tissue structure imaging data into data populations corresponding to tissue microstructures; constructing an image from the imaging data for at least one of the tissue microstructures; and storing or displaying the image. An apparatus embodying the disclosed method is also described, as well as a method for the quantitative measurement of a nerve tissue suspected of demyelination.

13 Claims, 5 Drawing Sheets

U.S. PATENT DOCUMENTS

| | | | |
|---|---|---|---|
| 7,095,890 B2 * | 8/2006 | Paragios et al. | 382/173 |
| 7,187,810 B2 * | 3/2007 | Clune et al. | 382/294 |
| 7,340,081 B2 * | 3/2008 | Chen et al. | 382/128 |
| 7,505,806 B2 * | 3/2009 | Masutani et al. | 600/410 |
| 7,580,555 B2 * | 8/2009 | Chen et al. | 382/128 |

OTHER PUBLICATIONS

Xiaohan et al., "Interactive Surface Segmentation for Medical Images", 3rd Int. Conf. on Signal Processing, Beijing China, Oct. 14, 1996, p. 1178-1181.

* cited by examiner

METHOD AND APPARATUS FOR THE NON-INVASIVE IMAGING OF ANATOMIC TISSUE STRUCTURES

CROSS REFERENCE TO RELATED APPLICATION

This application is a filing under 35 U.S.C. 371 of International Patent Application No. PCT/US01/04479 filed Feb. 12, 2001 and claims 35 U.S.C. §120 priority benefit as a Continuation Application of U.S. patent application Ser. No. 09/121,351 filed Jul. 23, 1998, now U.S. Pat. No. 6,205,235. The disclosures of both applications are incorporated herein by reference.

BACKGROUND OF THE INVENTION

The present invention relates to the non-invasive magnetic imaging of anatomic tissue structures in isolation from surrounding tissues, and, in particular, to the non-invasive magnetic imaging of nerve tissues. The present invention more specifically relates to the non-invasive quantitative measurement of damage to nerve tissue, such as the damage that occurs upon compression.

Clinically it is possible to estimate which neural pathway is involved in trauma by determining the end result loss of motor function and either aberrant sensory function or complete loss of it. It is very difficult to determine where the lesion is and to what extent it has caused deterioration of the nerves involved.

Peripheral nerves are compound structures. Each nerve trunk consists of a very large number of nerve "fibers" (neurites) that are protoplasmic extensions of neuronal cell bodies located in the dorsal root ganglia (sensory neurons) and ventral horn of the spinal cord (motor neurons). All nerve fibers (except fine pain fibers) are surrounded by a fatty sheath of myelin which serves to enhance nerve impulse conduction (neural flow). The nerve fibers are grouped into fasciculi, bundles of fibers bound together by a fine connective tissue membrane (epineureum). The bundles of fasciculi comprising the nerve trunk are bound by a thicker membrane, the perineureum. The nerve trunk may be surrounded by other layers of protective connective tissue or fat.

Neuropathy in peripheral nerves may occur through the agency of traumatic distortion, including compression, stretch and breakage, and/or associated ischemia. The trauma may be acute, especially when the surrounding tissues are injured, or it may be chronic, and due to pathologic mechanical relations between the nerve and surrounding tissues: regional compression is considered to be the principal etiology in entrapment syndromes. There is rapid recovery from transient compression, but prolonged compression extends the recovery period because the nerve fibers are damaged. Remyelination and re-establishment of conduction must take place. Chronic and repetitive compression prevents recovery and results in severe neurologic impairment.

In chronic and repetitive compressions, which are more common than acute compressions, the damage is more extensive. Nerve trunks become thinned at the site of the compression, but may swell proximally. Characteristically conduction is slowed and conduction blocks occur as long segments of myelin are damaged. Depending on the severity of the chronic compression, the nerve trunk proximally will contain a full complement of myelinated fibers within its fasciculi but at the level of compression and distally the number of myelinated fibers may be reduced significantly. The relative density of the myelinated fibers between proximal and distal portions of the nerve is a measure of loss of neurophysiologic function in its distal distribution.

Although nerve damage can occur anywhere within the body, some nerves are predisposed to chronic damage because of their structural relationships with other tissues. Classic sites for chronic nerve compression include the brachial plexus—especially where the cords of the plexus pass between the rib cage and clavicle, the elbow—where the ulna nerve winds around the olecranon process of the ulna bone, the carpal tunnel—where the median nerve lies between deep flexor tendons and the flexor retinaculum, the sacro-iliac region—where the lumbo-sacral trunk and sacral plexus lie on the bony surfaces of the pelvis, the gluteal region—where the sciatic nerve passes between the powerful gluteal musculature, the neck of the fibula—where the common peroneal nerve winds about the external surface of the bone, and the tarsal canal—where the tibial nerve winds beneath the tarsal bones to enter the sole of the foot.

Some nerves are vulnerable to acute trauma as a result of their intimate relationship to bones subject to fracture. These include that portion of the brachial plexus lying beneath the clavicle, the radial nerve—which winds about the shaft of the humerus, and the common peroneal nerve, which winds about the neck of the fibula.

Carpal Tunnel Syndrome (CTS) is defined as a pathologic condition in which the tunnel size is reduced, causing pressure on the median nerve with resultant pain and slight sensory impairment in the digits supplied by the nerve, and sometimes accompanied by slight wasting of the thenar muscles. The carpal groove is a deep concavity on the palmar surface of the carpus formed by lateral and medial projections of the carpal bones. The medial projection is formed by the pisiform bone and the hamulus—a hook-like projection of the hamate bone. The lateral projection is formed by the tubercles of the scaphoid and trapezium bones. The carpal groove is converted into an osteofibrous carpal tunnel by a strong fibrous retinaculum attached to the lateral and medial margins of the carpal groove. The carpal tunnel transmits the tendons of the deep and superficial digital flexor muscles which in this region form a firm bundle.

The median nerve lies within the tunnel between the flexor retinaculum and the flexor tendon bundle. It emerges from behind the flexor digitorum superficialis distally in the forearm about 5 cm proximal to the flexor retinaculum of the carpus. It lies superficial to the deep digital flexor tendons and between the tendons of the superficial flexor muscle and the flexor carpi radialis. The nerve then passes deep to the flexor retinaculum of the wrist where normally it lies superficial to the stout bundle of flexor tendons.

Overt morphology associated with CTS includes carpal dislocations, carpal arthritis and tenosynovitis of the long flexor tendons. These conditions clearly restrict the space within the tunnel. There is often no apparent morphologic cause for the syndrome, but as complete division of the flexor retinaculum results in relief from symptoms in most cases it is assumed that mechanical compression that is not obvious from the gross morphology of the tunnel or its contents causes ischemia or directly compresses the median nerve.

Clinical symptoms includes weakening of the thenar muscles, parasthesias of the lateral palm, thumb and first two fingers. Other symptoms may include stiffness of the wrist and some pain.

Clinical examination consists of identifying those symptoms known to be associated with nerve damage. The anatomic distribution of the branches of peripheral nerves is constant and well known. The distribution of abnormal sensation or inability to utilize one or more muscles is a sure indicator of which nerve involved.

Electromyography is used as a supplement to clinical examination. The technique uses needle electrodes inserted into suspect muscle. The intensity of the potentials measured is an indirect measure of the level of muscle activity. Neural flow stimulation also involves the use of needle electrodes. The technique compares input and output values of electric potentials.

None of these diagnostic techniques definitively identifies the focus of the neuropathy. In most cases, if the examination and electromyographic results are typical of those associated with a particular syndrome, the focus of the neuropathy can be estimated with some certainty based on experience; but false positive diagnoses are relatively common and may lead to unnecessary surgery or incomplete relief of the symptoms. In addition, electromyography is a relatively complex technique requiring some expertise to obtain a satisfactory diagnosis. Furthermore, the use of needle electrodes is invasive, and may prove painful. This can lead to false readings or patient rejection of the study.

A further problem is experienced with clinical examinations. Numerous patients attempt to simulate symptomatology in order to qualify for insurance compensation. Identifying these patients using an essentially subjective examination is difficult and time consuming for the diagnostician.

Despite conflicting reports in the literature, there is no convincing evidence that nerve morphology viewed in unassisted two-dimensional magnetic images is a clinically practical means of obtaining information about histological degeneration and impaired neural flow. At present, CTS patients are not referred for magnetic imaging scans as a diagnostic procedure.

SUMMARY OF THE INVENTION

It has now been discovered that post-scan data processing may be employed to resolve the problem of obtaining physiological information with significant clinical diagnostic value from magnetic imaging data. By first segmenting the imaging data to isolate anatomic tissue structures from surrounding tissues, high resolution three-dimensional images are obtained in which tissue microstructures are visible and provide clinically significant information relating to physiology. When imaging nerve tissues, it is possible to obtain neurophysiological information with significant clinical diagnostic value relating to the efficacy of nerve flow.

Therefore, according to one aspect of the present invention, a method is provided for the non-invasive imaging of an anatomic tissue structure in isolation from surrounding tissues, including the steps of:

receiving from an input device, magnetic imaging data from a patient of an anatomic tissue structure and the surrounding tissues;

segmenting the imaging data to isolate the anatomic tissue structure imaging data from the imaging data for the surrounding tissues;

separating the anatomic tissue structure imaging data into data populations corresponding to tissue microstructures;

constructing an image from imaging data for at least one of the tissue microstructures; and storing or displaying the image.

The imaging data my be acquired by either magnetic resonance or magnetic transfer imaging. Applications for the method of the present invention are not limited to the imaging of nerve tissue but apply to essentially any tissue structure for which it is difficult to obtain a high resolution image that is not obscured by surrounding tissues. Thus, the method of the present invention is particularly well suited for the imaging of vascular tissue and tumor tissue. The present invention makes possible high resolution images of tumor tissue boundaries that assist the surgeon in achieving the goal of complete tumor removal.

Therefore, according to another aspect of the present invention, an apparatus is provided for preforming the method of the invention. An apparatus in accordance with the present invention includes:

an input device for receiving magnetic imaging data from a patient;

a processing unit having:
  a first program for segmenting the magnetic imaging data to isolate imaging data for an anatomic tissue structure from imaging data for surrounding tissues;
  a second program for separating the anatomic tissue structure imaging data into data populations corresponding to tissue microstructures;
  a third program for constructing an image from imaging data for at least one of the microstructures; and
  a processor for sequentially executing the first, second and third programs;
  wherein the processor executes:
    the first program using the imaging data from the input device;
    the second program using the anatomic tissue first program; and
    the third program using the data populations obtained by execution of the second program; and an output device for displaying the image or a storage device for storing the image.

The present invention includes apparatuses for calculating the presence or loss of myelin in a nerve trunk or tract. Such apparatuses include devices that measure the myelin without first constructing an image of the nerve trunk or tract. An apparatus in accordance with this aspect of the present invention includes:

an input device for receiving imaging data from a patient of a nerve trunk or tract and the surrounding tissues;

a processing unit having:
  a first program for segmenting the magnetic imaging data to isolate imaging data for the nerve trunk or tract from the imaging data for the surrounding tissues;
  a second program for separating the nerve trunk or tract imaging data into data populations corresponding to fasciculi and other nerve trunk or tract microstructures;
  a third program for calculating the presence or loss of myelin in the nerve trunk or tract from the fasciculi imaging data; and
  a processor for sequentially executing the first, second and third programs;
  wherein the processor executes:
    the first program using imaging data from the input device;
    the second program using the nerve trunk or tract imaging data isolated by execution of the first program; and
    the third program using the fasciculi data population obtained by execution of the second program; and an output device for displaying the myelin calculation or a storage device for storing the myelin calculation.

The method and apparatus of the present invention are particularly useful for segmenting nerve tissue imaging data, enabling three-dimensional visualization of individual nerve fasciculi, and quantification of the percentage of fascicular tissue present in cross-sections of the nerve trunk. The numerical values obtained are represented in bivariate plots of percentage and cross-sectional location and directly indicate to the physician those parts of the nerve trunk where myelin content is reduced and neural flow is impaired, and the extent of the degeneration.

Therefore, according to another aspect of the present invention, a method is provided for the imaging of a nerve trunk or tract suspected of demyelination, including:

receiving from an input device, magnetic imaging data from a patient of a nerve trunk or tract suspected of demyelination and the surrounding tissues;

segmenting the imaging data to separate the imaging data for the nerve trunk or tract from the imaging data for the surrounding tissues;

separating the imaging data for the nerve trunk or tract into data populations corresponding to the fasciculi and other microstructures of the nerve trunk or tract;

constructing an image from imaging data for at least the fasciculi of the nerve trunk or tract; and storing or displaying the image.

The present invention incorporates the discovery that the imaging data for the fasciculi can be used to calculate the presence or loss of myelin in a nerve trunk or tract. Therefore, preferred methods according to this aspect of the present invention further include the steps of calculating from the imaging data for the fasciculi, the presence or loss of myelin in the nerve trunk or tract suspected of demyelination, and storing or displaying the myelin calculation.

According to another aspect of the present invention, the presence or loss of myelin in a nerve trunk or tract may be calculated from fasciculi imaging data independently of the construction of the nerve trunk image. The present invention therefore also includes a method for the quantitative measurement of a nerve trunk or tract suspected of demyelination, including the steps of:

receiving from an input device, magnetic imaging data from a patient of a nerve trunk or tract suspected of demyelination and the surrounding tissues;

segmenting the imaging data to separate the imaging data for the nerve trunk or tract from the imaging data for the surrounding tissues;

separating the imaging data for the nerve trunk or tract into data populations corresponding to the fasciculi and other microstructures of the nerve trunk or tract;

calculating from the fasciculi imaging data, the presence or loss of myelin in the nerve trunk or tract; and storing or displaying the myelin calculation.

The method of the present invention for quantitatively measuring nerve tissue demyelination is particularly useful for the non-invasive diagnosis of CTS. Therefore, according to yet another aspect of the present invention, a method is provided for the imaging of a median nerve suspected of demyelination within one of a patient's carpal tunnels, including the steps of:

receiving from an input device, magnetic imaging data from a patient including at least a portion of the median nerve passing through a carpel tunnel;

segmenting the imaging data to isolate the median nerve imaging data from any imaging data for surrounding tissues;

separating the median nerve imaging data into data populations corresponding to the fasciculi and other microstructures of the median nerve;

constructing an image from imaging data for at least the fasciculi of the median nerve; and storing or displaying the image.

This method can also be employed to calculate the presence or loss of myelin in the median nerve within a carpal tunnel from the fasciculi imaging data. Methods in accordance with this aspect of the present invention further include the steps of calculating from the fasciculi imaging the presence or loss of median nerve myelin within the carpal tunnel, and storing or displaying the myelin calculation.

The presence or loss of myelin in the median nerve within a carpal tunnel can also be calculated from the fasciculi imaging data independently of the construction of a median nerve image. The present invention therefore also includes a method for the quantitative measurement of a median nerve suspected of demyelination within one of a patient's carpal tunnels, including the steps of:

receiving from an input device, magnetic imaging data from a patient including at least a portion of the median nerve passing through a carpel tunnel;

segmenting the imaging data to isolate the median nerve imaging data from any imaging data for surrounding tissues;

separating the median nerve imaging data into data populations corresponding to the fasciculi and other microstructures of the median nerve;

calculating from the imaging data for the median nerve fasciculi, the presence or loss of myelin in the median nerve within the carpal tunnel; and storing or displaying the myelin calculation.

A more complete appreciation of the invention and many more other intended advantages can be readily obtained by reference to the following detailed description of the preferred embodiments and claims, taken in conjunction with the accompanying drawings, which disclose the principles of the invention, and the best modes which are presently contemplated for carrying them out.

DETAILED DESCRIPTION OF THE PREFERRED EMBODIMENTS

Figure 1:
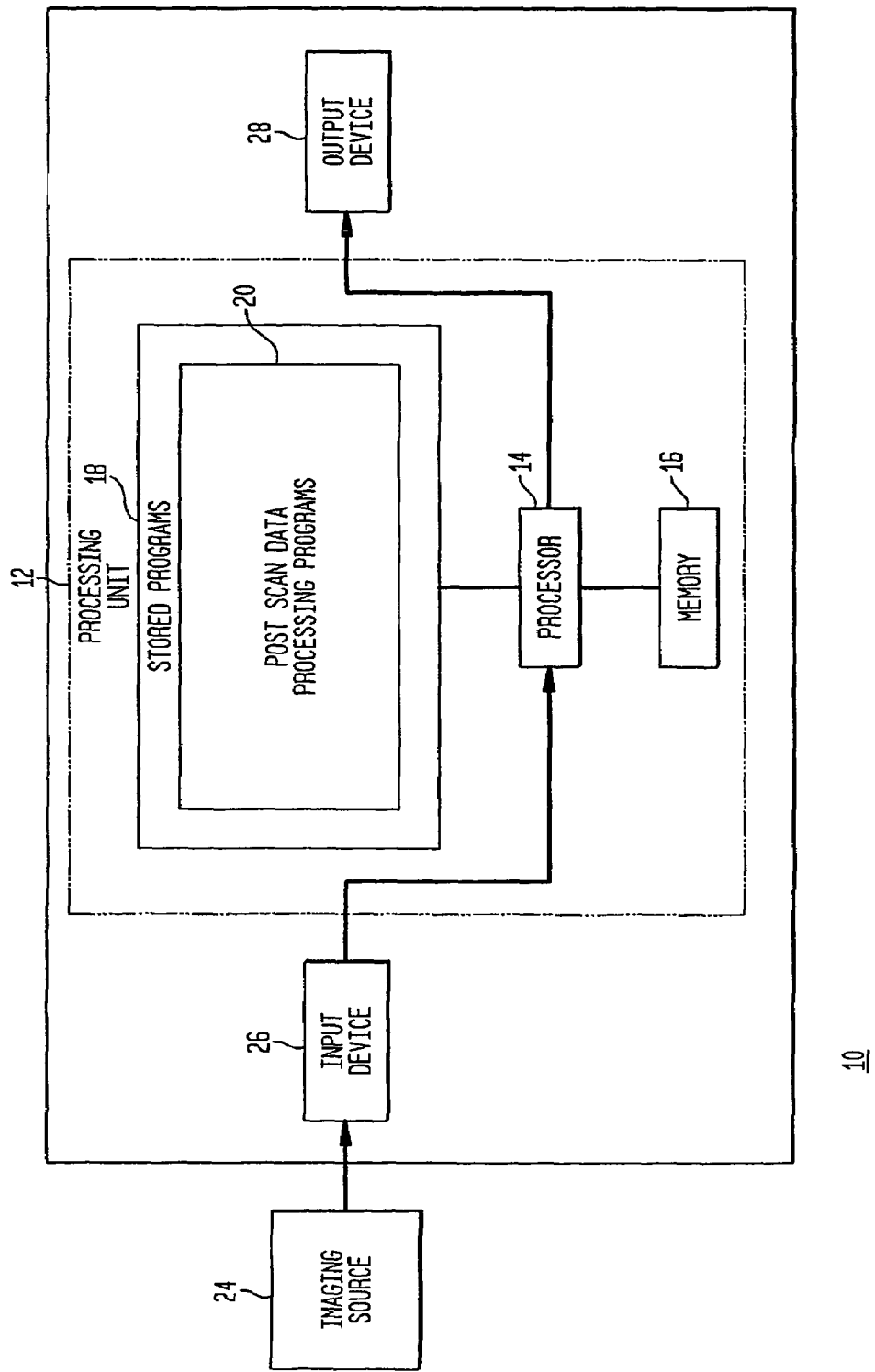
FIG. 1 is a block diagram of the components of an exemplary apparatus in accordance with the present invention.

Referring to the drawings, in which like reference numerals identify similar or identical elements, as shown in FIG. 1, the present disclosure describes a method and apparatus implementing an imaging device 10, which includes a processing unit 12 having processor 14, memory 16 and stored programs 18, including post-scan data processing programs 20. The processing device also includes an input device 26 and an output device 28.

The present invention is based on the discovery that by first segmenting imaging data to isolate anatomic tissue structures from surrounding tissues before histographically resegmenting the imaging data, it is possible to construct images of the tissue microstructures having exceptional clarity. The new methods and apparatus disclosed herein are particularly adapted for use in the diagnosis of neuropathy, especially the neuropathy resulting from compression and the associated demyelination, such as occurs with CTS.

In an exemplary embodiment, the processing unit 12 is an R1000 workstation from SGI having about 128 MB associated RAM memory and a 4 GB hard or fixed drive memory 16. The processor operates using a UNIX operating system to run application software 18 implementing the disclosed imaging device 10 and method.

It should be understood that the above described processor is merely exemplary. Any computer or processing system having sufficient processing ability and memory may be used.

Imaging data acquired by magnetic resonance or magnetic transfer imaging is provided by imaging source 24 through an input device 26 to the processor 14. The data source may be any source for providing magnetic resonance or magnetic transfer imaging data to a computer, such as a floppy disk containing an imaging data file, or the processor of a magnetic resonance or magnetic transfer imaging device (not shown), directly linked to a input port of processor 14, or by means of a modem interface. The input device 26 may be a floppy disk drive, modem, or other data reading or data input device, and also includes an interactive, semi-automatic or automatic contouring device for segmenting of anatomic structures. For purposes of the present invention "anatomic structures" are defined as the functional substructures within a gross organ, such as the functional microstructures within a nerve trunk, i.e., fasciculi, and the like.

Input device 26 may also include a keyboard or similar input device for supplying commands to processor 14. The command-supplying input device may also be provided as a second input device (not shown).

The processor 14 receives commands and imaging data from the imaging data source through the input device(s). The imaging data my be stored in memory 16 for further processing or used by the processor 14 to construct an image of a tissue target. The constructed image is sent to an output device 28 such as a visual image display device, for example, a video display terminal. A video terminal for displaying the original magnetic resonance or magnetic transfer image may also be included. The constructed image may also be displayed numerically or graphically through an appropriate output device.

Figure 2:
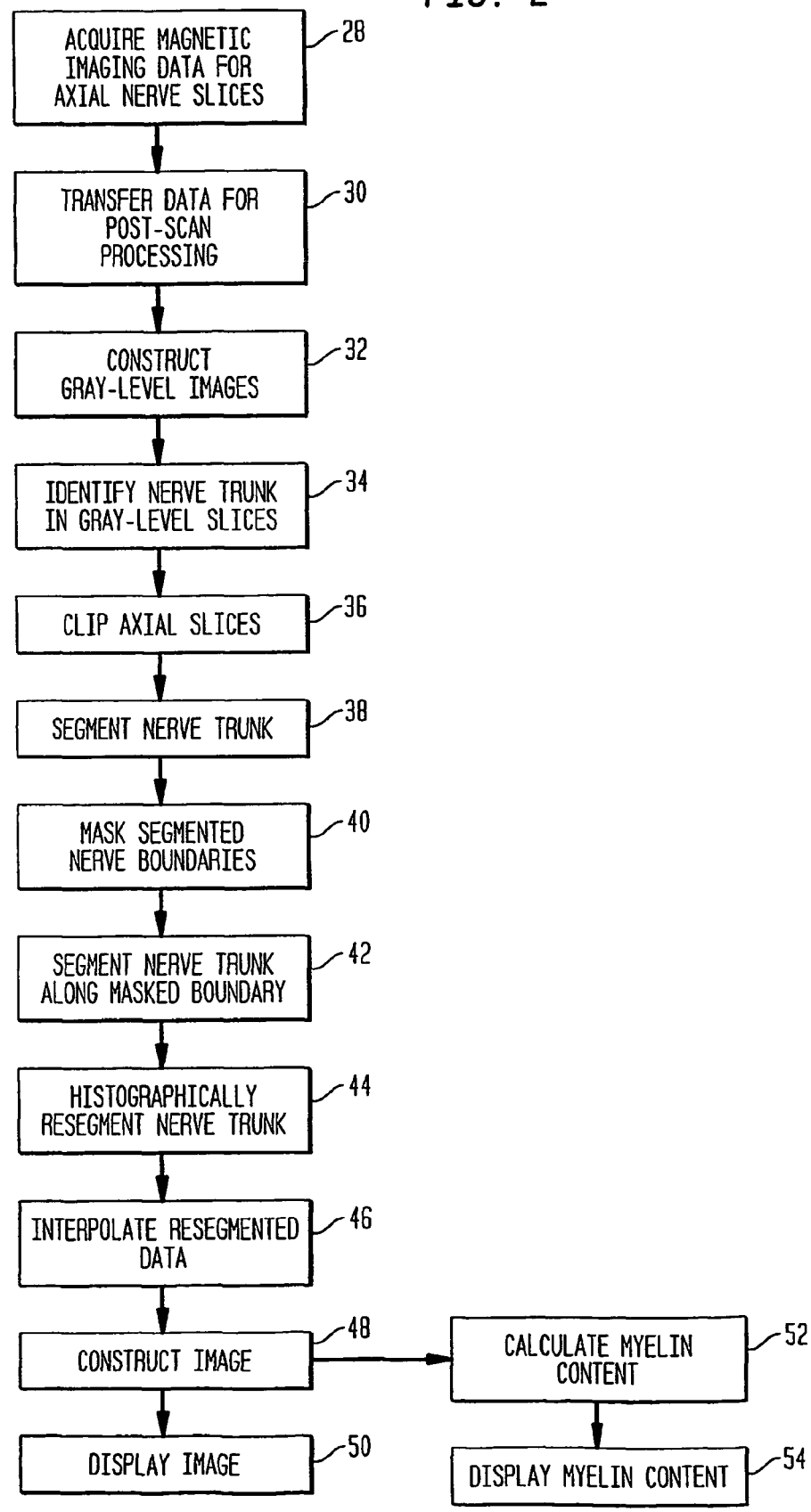
FIG. 2 is a flow chart illustrating an exemplary set of steps in accordance with the method of the present invention.

The imaging device 10 performs the applications programs described herein in conjunction with FIG. 2, which are implemented from compiled source code in the "C" programming language. Referring to FIG. 2, the imaging device 10 includes conventional imaging software, such as software for the display of original magnetic images. The imaging device also includes post-scan data processing programs, such as "clipping" software for discarding irrelevant data, and software for operating interactive, semi-automatic or automatic contouring devices for segmentation of anatomic structures.

The imaging device also includes post-scan data processing software for the creation of binary images of segmented structures and binary slices and software for the creation of three-dimensional binary masks and software for the segmentation of gray-level data representing the segmented structure via the binary mask. Post-scan data processing software for the histographic analysis of the gray-level data is also included, which performs single or iterative segmentation of the gray-level anatomic tissue structure into the intrinsic tissue microstructures, as well as software for the definition of material opacity, emission and surface reflection.

The imaging device post-scan data processing software also includes software for the creation of three-dimensional images of individual intrinsic tissue microstructures, or compound images of complete tissue structures, and software for image smoothing (aliasing). Post-scan data processing software is also included for the calculation of the central trunk (tract) axis (axes), cross-sections and tissue percentages and the graphical display of values.

FIG. 2 depicts an applications program for the imaging of a nerve trunk. In step 28 magnetic imaging data is acquired in 1 mm slices along the nerve trunk axial plane. In step 30 the data is transferred to a processor for post scan processing. In step 32 gray-level images of the magnetic imaging slices are constructed by the image display software.

In step 34 the interactive clipping software identifies the nerve trunk in the gray-level slices and in step 36 clip the first nerve trunk slice to eliminate the surrounding tissue imaging data. The rest of the slice stack is then automatically clipped, with modification of the clipping boundary as required. In step 38 the semi-interactive segmentation software identifies the nerve trunk boundary to the computer in the initial one or two slices, after which the software automatically segments the remaining slices and then checks and modifies the identified boundaries.

In step 40 the binary masking software creates two-dimensional binary masks for the segmented nerve boundaries. In step 42 the two-dimensional binary masks are used by the gray-level data segmentation software to segment the gray-level data representing the nerve trunk from the original magnetic resonance or magnetic transfer image slices.

In step 44 the histographic analysis software resegments the nerve trunk gray-level data for the segmented nerve trunk into nerve trunk microstructure data populations, including the fascicular bundles, the epineurium and inter-fascicular fascia. Interpolation of the resegmented data populations is performed in step 46. Software for the definition of material opacity, emission and surface reflection adjusts these features for individual microstructures to enhance their visualization within compound tissue images.

Still and movie images are then constructed by the three-dimensional imaging software in step 48. Both individual nerve tissue microstructure images and compound images of the nerve trunk composed of the individual nerve tissue microstructures are constructed.

In step 50 images are displayed, either as printed images or by viewing software as video displays. Optionally, the tissue calculation software determines in step 52, from the fasciculi imaging data, the amount of fascicular material in selected cross-sections, the values for which are presented graphically in step 54 by the display software.

Nerve trunks are readily visualized in high resolution T1 or T2 weighted magnetic resonance (MR) images. In cross-sections of a nerve trunk the fascicles appear as bright "spots" interspersed in a darker gray matrix which represent interstitial tissues, surrounded by a dark border of variable thickness that represents the perineureum and several layers of thin supporting fascia.

The relatively high amplitude signal from the fasciculi relates to the presence of myelin. Myelin is composed of lipids and protein, as in the plasma membranes of other cells, but the percentage of lipid is higher; and in addition to the usual suite of lipids found in plasma membranes, myelin contains a characteristic glycolipid. Myelin also contains up to 30% bound water.

When demyelination occurs, the loss of lipid molecules and the free interstitial water (which will affect ionic exchange rates between the free and bound water) reduces the amplitude of the MR signal within the bounding perineureum. Specifically, a percentage of the bright "spots"

will become no longer visible. Pathologic tissues will appear darker in MR images than do normal tissues, and the presence of fasciculi will be less apparent.

The presence of fasciculi can be partially detected by direct visual inspection of cross-sectional MR images. But determination of the number or percentage of fasciculi present in a cross-section, comparisons between different sections is not satisfactory via visual inspection alone. It is often not possible to resolve darker fasciculi and small changes in signal amplitude may go unobserved.

The method of the present invention is thus used to generate three-dimensional images of the fasciculi, which can be visualized in a static format, or which may be rotated about the (approximate) long axis of the trunk. The latter enhances the visualization process. Because the three-dimensional image can be limited to the fasciculi, the local density of these structures within the trunk, and their brightness (signal amplitude) are now relatively easy to visualize directly.

With the present invention, it is now possible to quantify nerve trunk demyelination values from the generated images, which were heretofore measured either invasively or subjectively. Nerve tissue demyelination is determined by first calculating the volume of fascicular tissue as a percentage of the volume of the gross trunk (tract) structure. Next, the area of fascicular tissue as a percentage of the area of the, gross trunk (tract) structure as seen in selected cross-sections of the trunk (tract) is calculated. The contiguous cross sectional areas of the trunk (tract) of specified thickness (i.e., 1 mm) perpendicular to the long axis is then calculated.

The percentage of volume of fascicular tissue as a percentage of total volume of the trunk (tract) in contiguous cross-sections is calculated next. A graphical display of the percentage volumes obtained vs. location of the sections on the central axis of the trunk is then constructed. The variation of myelin content as indicated by these percentage values is a measure of the neurophysiologic (flow efficiency) status of the trunk (nerve) and thus a diagnostically significant index.

This technique enables a comparison of the percentage of fascicular tissue present, for example, in the forearm (where entrapment and compression is unlikely), with the value for fascicular tissue within the carpal tunnel, and in regions of the trunk distal to the carpal tunnel. It is also possible to compare fascicular percentages in homologous regions from different individuals (compare between patients).

The method of the present invention thus allows for the fascicular percentages to be calculated for cross-sectional areas of a nerve trunk. For the median nerve, fascicular percentages for 1 mm thick contiguous sections normal to the long axis of the trunk may be calculated, and then represented as a bivariate plot of percentage of fascicular material present vs. location within the trunk. This graphical representation provides the CTS diagnostician with a simple and direct means of determining in which precise regions of the median nerve trunk a loss of fascicular material has occurred, and the amount of fascicular tissue lost.

A drawback in using MR images for inter-patient comparisons is that the scale of gray-level values representing different types of tissue is scanner dependant and consequently varies between scanners. Magnetic Transfer Imaging (MTI) is a new technique that has two advantages over conventional MR imaging when applied to analysis of nerve trunks. First, the in-plane resolution is improved. Second, the data values obtained with this technique are not scanner dependant and consequently direct inter-patient comparisons are possible.

The possibility of using MTI for the analysis of nerve tissue has been discussed in the literature. The loss of bound protons in the degenerating myelin sheath has the effect, via magnetic transfer, of depressing the MR signal from free protons in the immediate vicinity of the fasciculi. The Magnetic Transfer function can be calculated, and the resultant values used to create MT images. Thus, MTI is particularly well-suited for use with the methods and apparatus of the present invention.

The method and apparatus of the present invention are also well-suited for the diagnosis of nerve pathology. In diagnostic methods according to the present invention, a clinical examination is typically first performed to determine the likely location of nerve pathology. A high-resolution magnetic image of the region is then obtained.

The MR data comprises thin (1 mm) contiguous slices in a plane which is more or less normal to the axis of the nerve. High resolution images can be obtained by using scan times up to ten minutes.

Post-scan data processing is then applied to the MR data. MR hard-copy (acetate) is not required. The three-dimensional MR data is loaded into the three-dimensional imaging software. Steps in the subsequent data processing are as follows:

The original MR slices are displayed. The nerve is identified and image contrast adjusted to maximize its visualization by the operator. This contrast adjustment does not affect the signal differential marking the boundary of the nerve, and is not a factor in subsequent segmentation.

The size of the data set is reduced by data clipping to discard all data except that in the immediate vicinity of the nerve. Once a region of interest has been defined, clipping is automatic; thus, the size of the region of interest relates to the position of the nerve on successive images.

Interpolation of the imaging data is then performed. The original voxels are prismatic; i.e., in the Z direction (thickness of image-slice) they are usually 1 mm. The dimensions of X and Y (in the plane of the slice) depend on the imaging protocol. Typically X and Y are 0.5-0.7 mm. Cubile voxels are required for 3-dimensional rendering; thus, it is necessary to interpolate the data set in the Z direction in order to obtain slices corresponding in thickness to the X,Y dimensions. The interpolation process is not simple data averaging; it utilizes a sophisticated algorithm which identifies the "shape" of regions of consistent signal in contiguous slices and calculates intermediate "shapes" (assuming linearity in shape change between slices). Shape based interpolation has been shown to produce highly accurate information in the interpolated slices. Interpolation is usually performed after clipping and segmentation on the binary image produced. This reduces the time required to perform interactive contouring during the process of segmentation.

Automatic segmentation of MR data is difficult because of the non-linear signal. At present several different techniques are used to contour the boundary of the region of interest on the original MR images. They are interactive, live-wire and live-path contouring.

With interactive segmentation the operator traces the boundary of the nerve trunk section, recording coordinates on the boundary in so doing. In live-wire segmentation, the boundary of the nerve as seen in cross-section is identified by the operator and indicated to the computer. The computer is thus able to identify subsequently contiguous voxels with the same boundary signal characteristics. Once the boundary has been identified, the operator can indicate a starting point on it, then move the cursor to a next point some distance away from the first.

The computer is able to track the boundary between the two points using the boundary information provided, and draws a colored line to mark it. Because the boundary signal varies, and the presence of adjacent non-boundary pixels with similar signal characteristics, the boundary selected automatically may vary from that which the operator judges to be correct. In this case the boundary is redefined at the point of divergence (i.e., the boundary-contour is corrected) and the technique of indicating points at intervals along the boundary is continued until the boundary is closed. Boundary identification during contouring is used to refine the suite of signal characteristics used by the computer to determine the boundary automatically. After one or two boundaries have been contoured it is usually only necessary to indicate two or three points to obtain a complete, accurate boundary.

This technique can be extended to automatic identification of the boundary in subsequent slices, which speeds up the procedure. Usually the operator examines the automatically generated boundary contours and can correct any errors. The continually refined boundary characteristics are stored by the computer and can be utilized to segment other data sets obtained via similar imaging protocols.

Live-path contouring is similar to live-wire contouring, but the computer only seeks boundary characteristics coinciding with those defined for it in a "path" of limited width on either side of the cursor. It is possible to run the cursor rapidly around the region of interest, without following the boundary exactly, to describe a contour within the limits of the defined path, for a very rapid method of contouring.

Live-wire and live-path contouring techniques are normally carried out on all the original MR slices. However, these techniques may be developed so that contours are only defined interactively on the first two or three slices, after which the computer will search for the corresponding boundary in the remaining slices and contour them automatically.

The segmentation techniques output the surface boundary of the region of interest by a binary separation of the three dimensional data based on those voxels within the boundary and those without it. Three-dimensional imaging of the binary data therefore yields a "solid" object. However, the boundary surface can be used as a "mask" to extract MR data within the region of interest from the original three-dimensional MR data matrix. The extracted MR data set is referred to as a gray-level image.

The gray-level image thus contains information about the tissue microstructures contained within the nerve trunk. The gray-level values for nerve fasciculi, matrix, and perineureum comprise distinct and overlapping populations. In the region of signal overlap the percentage of signal belonging to each material can be ranges of signal values assigned accordingly. This allows the different tissue types to be resegmented automatically based on this histographic data. The histographic resegmentation may be performed iteratively in order to resolve any signal overlap to obtain the best visualization of the nerve tissue microstructures (i.e., visualization of the very distinctive fasciculi).

Opacity, emission and surface strength parameters optimal for visualization of the nerve microstructures are then determined by creation of three-dimensional images and examination of the anatomy. Once values have been determined for these parameters, they may be used for more automated imaging in subsequent data sets. Improvement of visualization by adjusting these parameters is a distinct process from segmentation and does not select the tissue concerned from its surrounding matrix.

The output is visual and numerical Visual results consist of three-dimensional renderings of the trunk, including a compound image of the gross structure, which includes the perineurium, fascicles and interfascicular tissue. The opacity of the perineurium is set so that this tissue is translucent. This enables the content of the nerve trunk to be viewed in the context of the perineurium. Similarly, the opacity of the interfascicular tissue is set to be greater than that of the perineurium, but less than that of the fascicles. The result is to display the microstructures of the nerve in their correct anatomic relationships.

To enhance the three-dimensionality of the image, and to enable the anatomic relationships to be examined from all angles, the image is rotated about its long axis and recorded as multiple "frames" which are stored in a "cine" file. This is performed using conventional MR imaging software. Images are also created containing each of the material sets separately, and cine files created for each. These images allow direct examination of each microstructure separately.

A compound image consisting of the perineureum and fasciculae is also created and rendered in a cine file. This image allows the texture and thickness of the perineureum to be examined in the context of the fasciculi, and regions of membrane thickening or thinning compared with regions of MR signal fluctuation in the fasciculi.

The numerical output includes the cross-sectional area value for the nerve trunk normal to its long axis, calculated continuously throughout its length and displayed in a bivariate plot of cross-sectional area vs. section location. A similar bivariate plot is calculated to show the density of fascicular material within the cross-section vs. location.

The parameters measured by the method and apparatus of the present invention for nerve tissue include the general morphology of the trunk (tract), the cross-sectional morphology, the size and distribution of the nerve fasciculi and the density of the fasciculi within cross-sections of the nerve trunk. These parameters are associated with physiologic changes accompanying nerve damage and dysfunction.

Gross morphology and cross-sectional morphology are physical reflections of the pressure environment. It is well known that in regions of pressure a peripheral nerve reorganizes by becoming flattened in a plane normal to the compressive force. The amount of flattening almost certainly relates to altered function, but the sensitivity of the relationship may not be adequate for the purpose of early diagnosis.

In regions of compression the size of the fascicles decreases, but they increase in number, forming smaller bundles. The cross-section of the neurites can be measured.

However, cross-sectional fascicular density is a measure of MR signal from the "fascicular material" present in the section. The MR signal may be expected to vary with the histochemistry of the nerve fibers (neurites) and their interstitial environment. This includes changes in the structure and chemistry of the myelin sheaths (composed of complex lipids and a high percentage of bound water) and in the ionic environment of the neurite and interstitial tissues. Thus, variation in the MR signal is an indicator of functional changes in the neurites, including those due to trauma.

Signal variation can be detected in two ways. One way is by direct examination of the final image. Regions of nerve trauma are likely to be represented by localized disappearance of the fasciculi. The extent of fascicular disappearance is an indication of the severity of the nerve damage. The MR signal variation can also be quantified by measuring the density of the fascicular material in cross-sections of the nerve trunk and plotting this data against the locations of the cross-sections.

Neural flow studies can be made on the median nerve in the region of the carpal tunnel because of the very superficial placement of the trunk in this region. However, neuropathies occur in other regions, both within and outside the central nervous system where neural flow studies are impractical because of the depth of the trunk. The methods and apparatus of the present invention provide an innovative means of diagnosing and assessing neuropathy in such deep peripheral nerves, and in portions of the central nervous system.

The neuropathy need not be associated with compression or other trauma, but may also result from other causes, such as multiple sclerosis and related diseases. Until now it was not possible to assess quantitatively the progression of a disease like multiple sclerosis, or the effectiveness of treatment. Instead, practitioners were forced to rely upon the subjective assessment of the patient. This was particularly inaccurate in most circumstances, in which patients want to believe that a treatment is working and relate their well-being from this perspective.

The methods and apparatus of the present invention may also be used to assess other tissues that are inaccessible because of their depth within the body, including vascular tissues and tumor tissues. The present invention makes it possible to visualize vascular blockage, as well as tumor tissue boundaries. The ability to visualize tumor tissue boundaries makes the present invention a particularly useful tool for the cancer surgeon.

Proof of the concept of method of the invention for the analysis of neuropathy was obtained via a feasibility study of the median nerve in patients diagnosed with CTS and non-symptomatic subjects. The feasibility study is presented to illustrate certain aspects of the invention, and should not be interpreted as limiting the scope of the invention as it is defined by the claims.

Twenty wrists, including four cadaver wrists, were scanned and analyzed using the technique described above. Subjects scanned in vivo included clinically diagnosed patients with severe CTS, less severe CTS, and control (asymptomatic) subjects.

Figure 3:
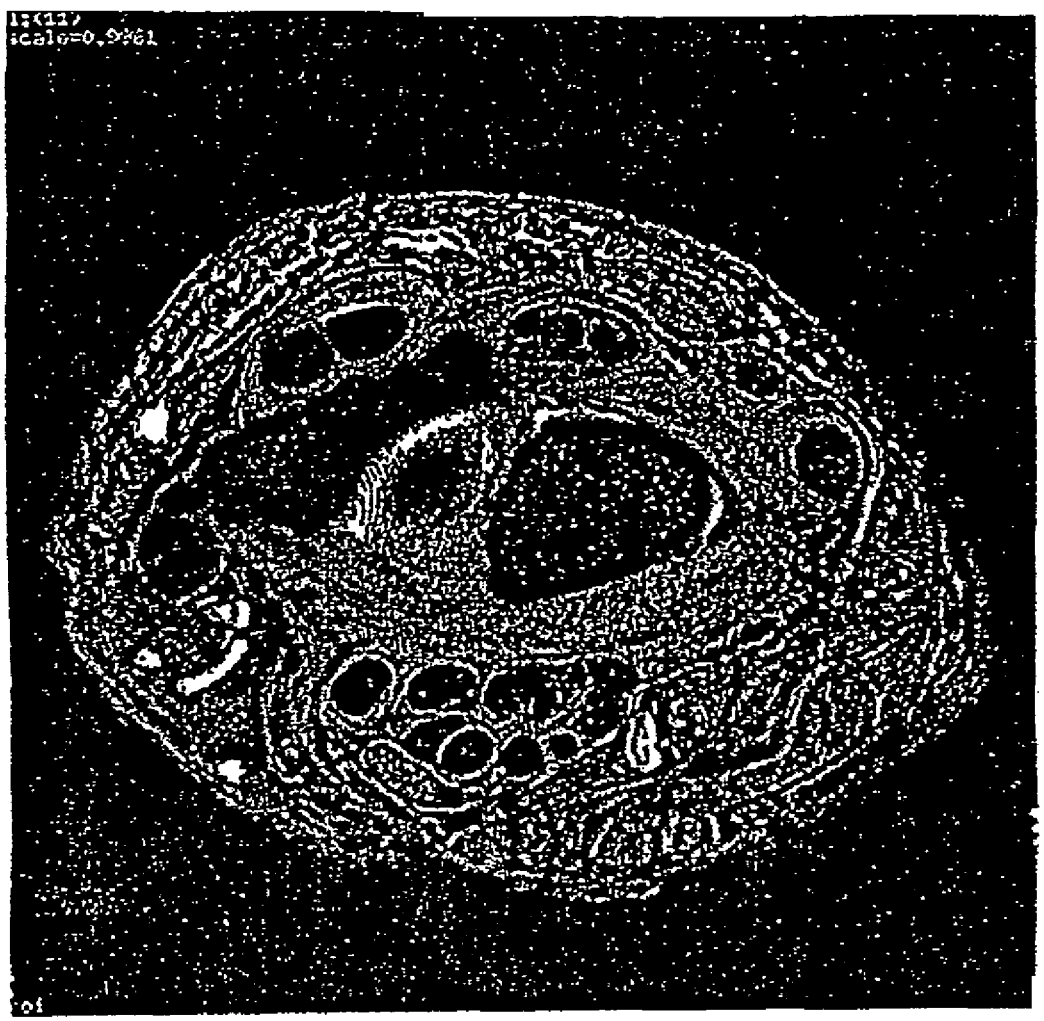
FIG. 3 is a prior art axial cross-section of a wrist, including the median nerve, obtained by magnetic resonance imaging.

Results showed:

a. Clear feasibility of "dissecting" and quantifying nerve trunk structures is possible using this analytic system. A prior art axial cross-section of a wrist obtained by magnetic resonance imaging is shown in FIG. 3. The cross-sectional image includes the median nerve and associated tendons and carpal bones. This Figure illustrates how such images provided little information of clinical diagnostic value relating to neurophysiology.

Figure 4:
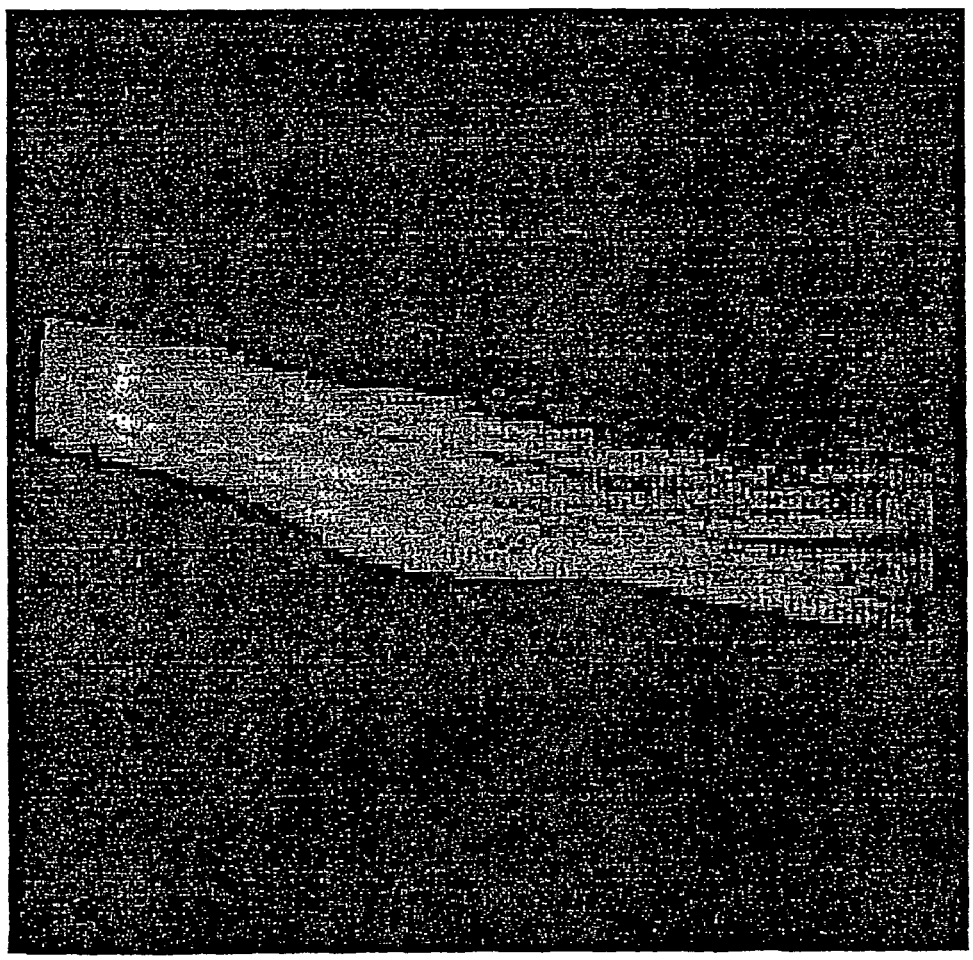
FIG. 4 is a magnetic resonance image of a healthy median nerve within a carpal tunnel of a patient, constructed by an apparatus of the present invention employing the method of the present invention.
Figure 5:
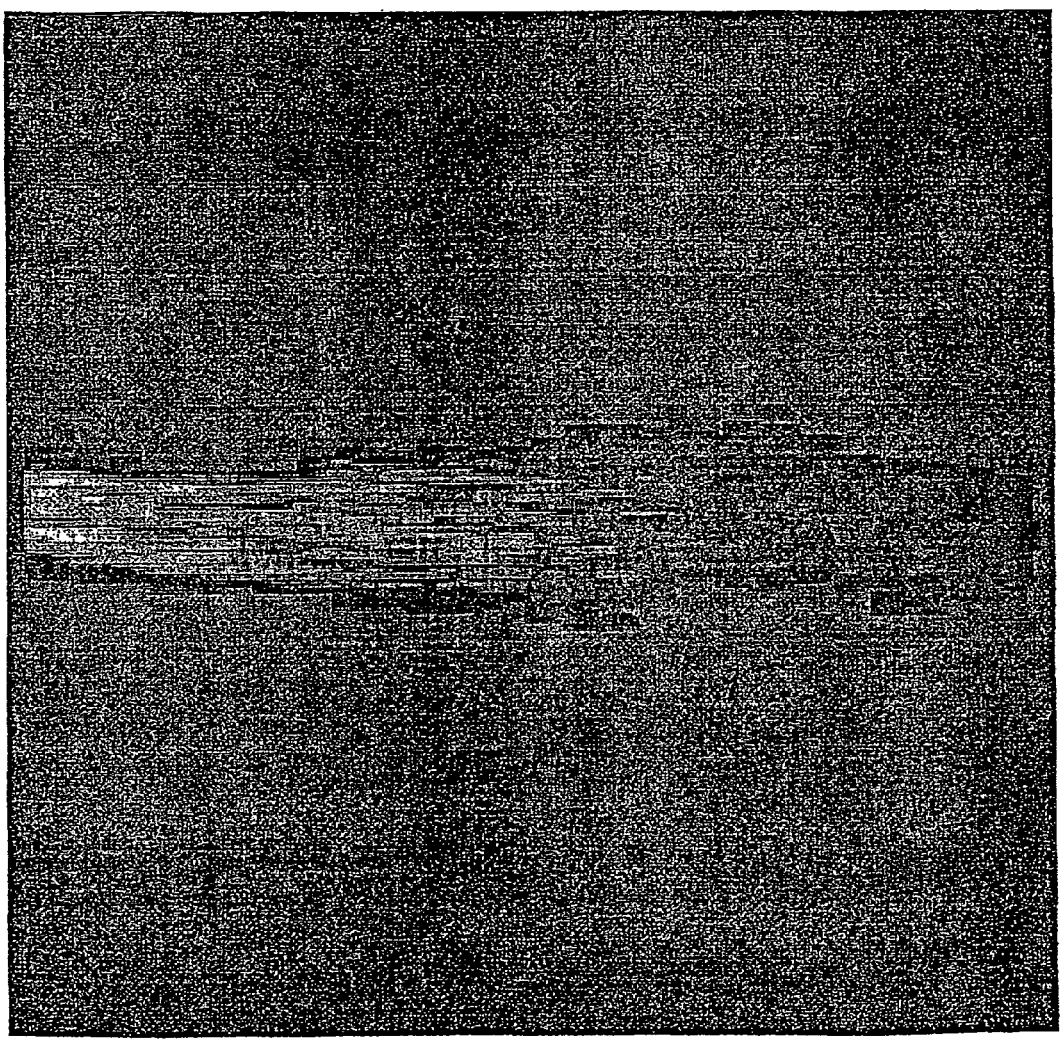
FIG. 5 is a magnetic resonance image of a median nerve within a carpal tunnel of a patient suffering from CTS, constructed by the same apparatus and method employed to construct the image of FIG. 4.

A magnetic resonance image of a healthy median nerve trunk constructed by the method and apparatus of the present invention is shown in FIG. 4. The white streaks are bundles of myelinated nerve fibers, i.e., fasciculi. This is in contrast to the magnetic resonance image of a median nerve trunk of a patient afflicted with CTS, shown in FIG. 5, and also constructed by the method and apparatus of the present invention. The nerve fiber demyelination is dramatically evident.

b. MR signal amplitude was reduced where the nerve trunk passes beneath the flexor retinaculum Reduction of signal amplitude is modest in subjects with no clinical symptoms of CTS, but becomes increasingly significant with CTS symptoms, and is pronounced in subjects diagnosed with severe CTS.

The four cadaver wrists were also subjected to MR scanning. Evidence of demyelination in these wrists was partially confirmed by extirpation of the median nerve from the carpal tunnel and histologic sectioning and staining.

CONCLUSIONS

The results strongly supported the hypothesis that nerve degeneration can be detected and localized in CTS. The extent of degeneration determined by this procedure in CTS patients appears to be associated with the severity of symptoms.

Thus, using the methods and apparatus of the present invention, it is possible to determine if demyelination has occurred, the percentage of myelin loss in the affected region compared with other "functionally normal" regions, and to precisely localize the neuropathy. This provides a non-invasive, objective and quantified diagnostic procedure.

As will be readily appreciated, numerous variations and combinations of the features set forth above can be utilized without departing from the pre-sent invention as set forth in the claims. Such variations are not regarded as a departure from the spirit and scope of the invention, and all such variations are intended to be included within the scope of the following claims.

What is claimed is:

1. A method for the analysis of a nerve trunk or tract suspected of demyelination comprising:
   generating an image from magnetic resonance or magnetic transfer imaging data of a nerve trunk or tract suspected of demyelination and the surrounding tissues characterized in that said imaging data comprises imaging data for myelin-bound water;
   segmenting said image to separate the image of said nerve trunk or tract from said image for said surrounding tissues;
   separating said imaging data for said segmented image of said nerve trunk or tract into data populations corresponding to the fasciculi and other microstructures of said nerve trunk or tract;
   generating a three-dimensional image of said fasciculi from said corresponding data population and displaying said image in a static format or rotated about the long axis of said nerve trunk;
   calculating from said three-dimensional fasciculi imaging data the presence or loss of myelin in said nerve trunk or tract; and
   storing or displaying said myelin calculation.

2. The method of claim 1, wherein said imaging data for said nerve trunk or tract is separated into microstructure data populations by histographic resegmenting.

3. The method of claim 2, wherein said histographic resegmenting is performed iteratively to separate any overlapping microstructure data populations.

4. The method of claim 1, wherein said imaging data for said nerve trunk or tract is segmented by interactive contouring.

5. The method of claim 1, wherein said imaging data for said nerve trunk or tract is segmented by live-wire contouring.

6. The method of claim 1, wherein said microstructures of said nerve trunk or tract also include the perineureum and inter-fascicular tissue.

7. The method of claim 1, wherein said imaging data is acquired by magnetic resonance imaging.

8. The method of claim 1, wherein said constructing step comprises constructing a compound image of said nerve trunk or tract comprising imaging data from a plurality of nerve tissue microstructures.

9. The method of claim 8, wherein at least one of the material opacity, emission and surface reflection for at least one of said microstructures of said compound image is adjusted to enhance the visualization of said nerve trunk or tract.

10. The method of claim 9, wherein said compound image also includes the perineurium and inter-fascicular tissue, and the opacity of said inter-fascicular tissue is set to be greater than the opacity of said perineurium, but less than that of said fasciculi.

11. The method of claim 10, wherein said opacity of said perineurium is set to appear translucent.

12. The method of claim 1, further comprising the step of comparing said myelin calculation to a myelin calculation obtained for another portion of said nerve trunk or tract.

13. The method of claim 1, wherein said nerve trunk or tract is the median nerve.

* * * * *